United States Patent
Wang et al.

(10) Patent No.: US 10,629,737 B2
(45) Date of Patent: *Apr. 21, 2020

(54) METHOD FOR FABRICATING FINFET INCLUDING FORMING AN OXIDE LAYER

(71) Applicant: Taiwan Semiconductor Manufacturing Company, Ltd., Hsinchu (TW)

(72) Inventors: Chih-Hao Wang, Hsinchu County (TW); Gwan-Sin Chang, Hsinchu (TW); Kuo-Cheng Ching, Hsinchu County (TW); Zhiqiang Wu, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 234 days.

This patent is subject to a terminal disclaimer.

(21) Appl. No.: 15/495,069

(22) Filed: Apr. 24, 2017

(65) Prior Publication Data

US 2017/0229561 A1 Aug. 10, 2017

Related U.S. Application Data

(60) Continuation of application No. 15/130,370, filed on Apr. 15, 2016, now Pat. No. 9,634,127, which is a
(Continued)

(51) Int. Cl.
*H01L 29/78* (2006.01)
*H01L 21/306* (2006.01)
(Continued)

(52) U.S. Cl.
CPC ...... *H01L 29/785* (2013.01); *H01L 21/02164* (2013.01); *H01L 21/02236* (2013.01);
(Continued)

(58) Field of Classification Search
None
See application file for complete search history.

(56) References Cited

U.S. PATENT DOCUMENTS 6,475,869 B1   11/2002   Yu
7,078,299 B2   7/2006    Maszara
(Continued)

OTHER PUBLICATIONS

Masanori Tanaka et al., "Abnormal Oxidation Characteristics of SiGe/Si-on-insulator Structures Depending on Piled-Up Ge Fraction at SiO2/SiGe Interface," Journal of Applied Physics 103, 2008 American Institute of Physics (AIP), six (6) pages.

*Primary Examiner* — Daniel Whalen
(74) *Attorney, Agent, or Firm* — Haynes and Boone, LLP

(57) ABSTRACT

Methods are disclosed herein for fabricating integrated circuit devices, such as fin-like field-effect transistors (FinFETs). An exemplary method includes forming a first semiconductor material layer over a fin portion of a substrate; forming a second semiconductor material layer over the first semiconductor material layer; and converting a portion of the first semiconductor material layer to a first semiconductor oxide layer. The fin portion of the substrate, the first semiconductor material layer, the first semiconductor oxide layer, and the second semiconductor material layer form a fin. The method further includes forming a gate stack overwrapping the fin.

19 Claims, 15 Drawing Sheets

Related U.S. Application Data division of application No. 13/902,322, filed on May 24, 2013, now Pat. No. 9,318,606, which is a continuation-in-part of application No. 13/740,373, filed on Jan. 14, 2013, now Pat. No. 8,901,607.

(60) Provisional application No. 61/799,468, filed on Mar. 15, 2013.

(51) Int. Cl.
  *H01L 29/66* (2006.01)
  *H01L 21/02* (2006.01)
  *H01L 21/28* (2006.01)
  *H01L 21/3065* (2006.01)
  *H01L 21/8234* (2006.01)

(52) U.S. Cl.
  CPC .. *H01L 21/02255* (2013.01); *H01L 21/28229* (2013.01); *H01L 21/3065* (2013.01); *H01L 21/30604* (2013.01); *H01L 21/823425* (2013.01); *H01L 21/823431* (2013.01); *H01L 21/823456* (2013.01); *H01L 21/823462* (2013.01); *H01L 29/66545* (2013.01); *H01L 29/66795* (2013.01); *H01L 29/66818* (2013.01); *H01L 29/7856* (2013.01)

(56) References Cited

U.S. PATENT DOCUMENTS

| | | |
|---|---|---|
| 7,297,600 B2 | 11/2007 | Oh |
| 7,485,520 B2 | 2/2009 | Zhu et al. |
| 7,709,312 B2 | 5/2010 | Jin |
| 7,741,182 B2 | 6/2010 | Van Noort |
| 7,939,889 B2 | 5/2011 | Yu |
| 7,993,999 B2 | 8/2011 | Basker |
| 8,053,299 B2 | 11/2011 | Xu |
| 8,058,692 B2 | 11/2011 | Lai |
| 8,101,486 B2 | 1/2012 | Maszara |
| 8,211,772 B2 | 7/2012 | Kavalieros |
| 8,242,555 B2 | 8/2012 | Hanafi et al. |
| 8,310,013 B2 | 11/2012 | Lin |
| 8,362,575 B2 | 1/2013 | Kwok |
| 8,395,195 B2 | 3/2013 | Chang et al. |
| 8,482,073 B2 | 7/2013 | Chen et al. |
| 8,729,627 B2 | 5/2014 | Cheng et al. |
| 9,634,127 B2 * | 4/2017 | Ching ................... H01L 29/785 |
| 2006/0076625 A1 | 4/2006 | Lee |
| 2011/0193178 A1 * | 8/2011 | Chang ............... H01L 29/66795 257/408 |

* cited by examiner

METHOD FOR FABRICATING FINFET INCLUDING FORMING AN OXIDE LAYER

CROSS-REFERENCE TO PRIORITY APPLICATIONS

The present application is a continuation application of U.S. patent application Ser. No. 15/130,370, filed Apr. 15, 2016, which is a divisional application of U.S. patent application Ser. No. 13/902,322, filed May 24, 2013, which is a non-provisional patent application of U.S. Provisional Patent Application Ser. No. 61/799,468, filed Mar. 15, 2013 and is a continuation-in-part of U.S. application Ser. No. 13/740,373, filed Jan. 14, 2013, now U.S. Pat. No. 8,901,607, the entire disclosures of which are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects. Improvements in this area are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

U.S. patent application Ser. No. 13/740,373, filed Jan. 14, 2013, is hereby incorporated by reference.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments. It is understood, however, that the application should not be limited to a particular type of device, except as specifically claimed.

Figure 1:
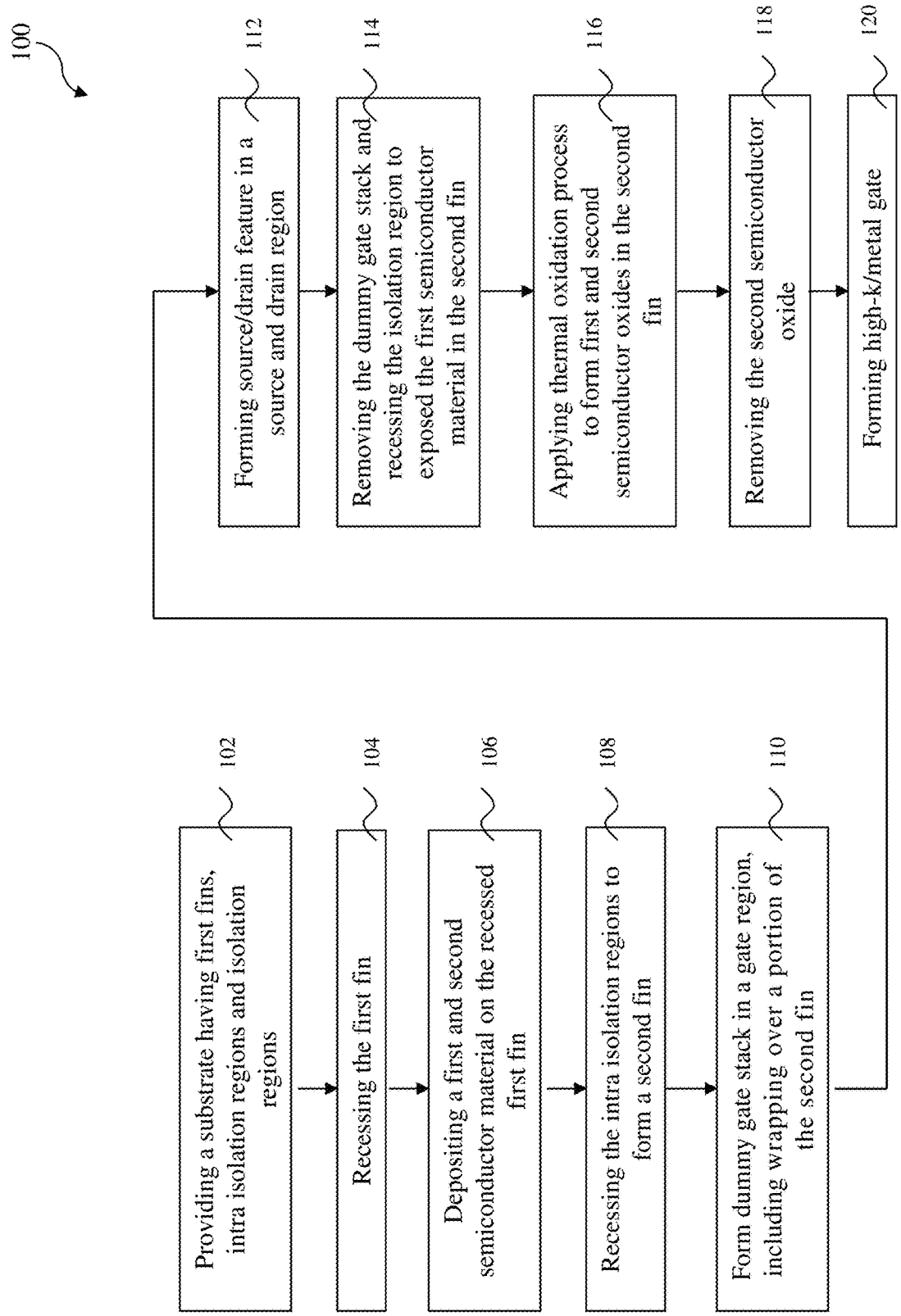
FIG. 1 is a flow chart of an example method for fabricating a FinFET device according to various aspects of the present disclosure.

FIG. 1 is a flowchart of a method 100 for fabricating a FinFET device according to aspects of the present disclosure. It is understood that additional steps can be provided before, during, and after the method, and some of the steps described can be replaced or eliminated for other embodiments of the method. The disclosure also discusses several different embodiments of a FinFET device 200, as shown in FIGS. 2A-13, manufactured according to the method 100. The present disclosure repeats reference numerals and/or letters in the various embodiments. This repetition is for the purpose of simplicity and clarity and does not in itself dictate a relationship between the various embodiments and/or configurations discussed.

Figure 2A:
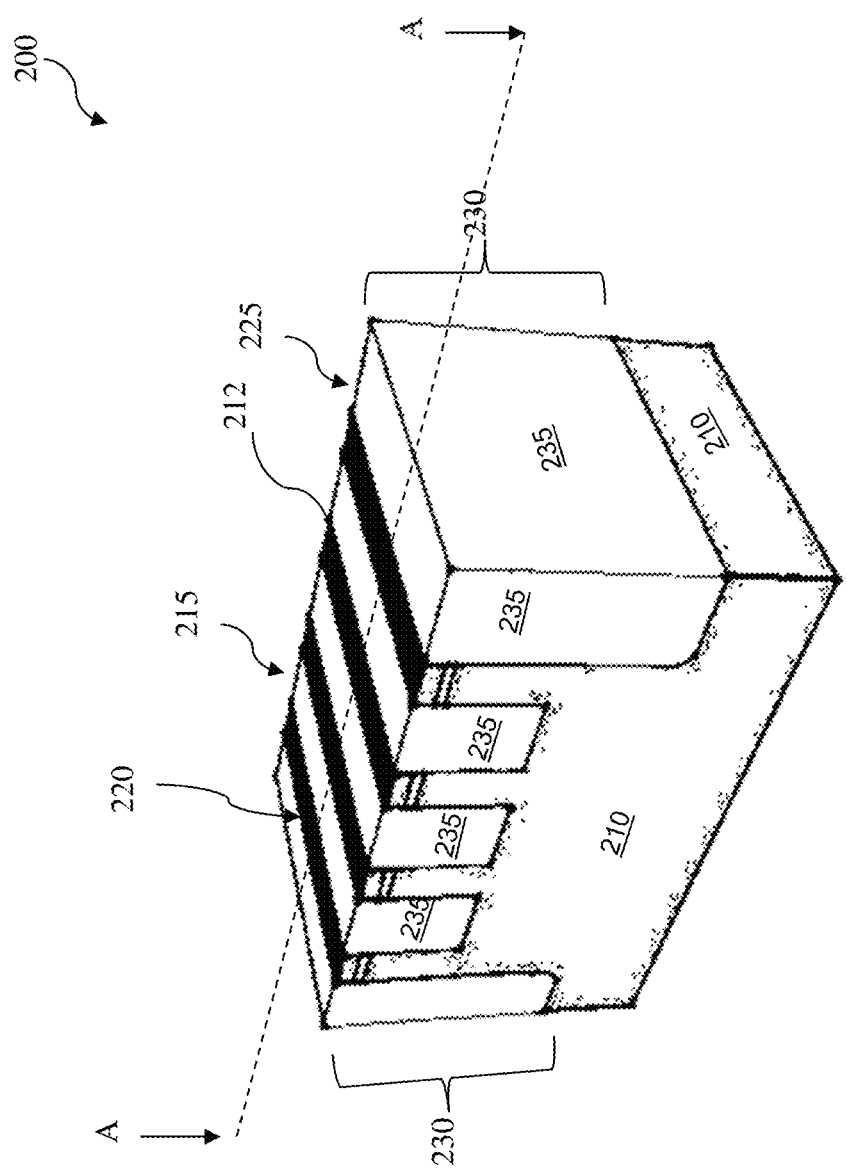
FIG. 2A is a diagrammatic perspective view of a FinFET device undergoing processes according to an embodiment of the present disclosure.

FIG. 2A is a diagrammatic perspective view of a first embodiment of a FinFET device 200 undergoing processes according to the method of FIG. 1. FIG. 2B and FIGS. 4-6 are cross-sectional views of an example of the FinFET device 200 along line A-A in FIG. 2A.

Figure 3A:
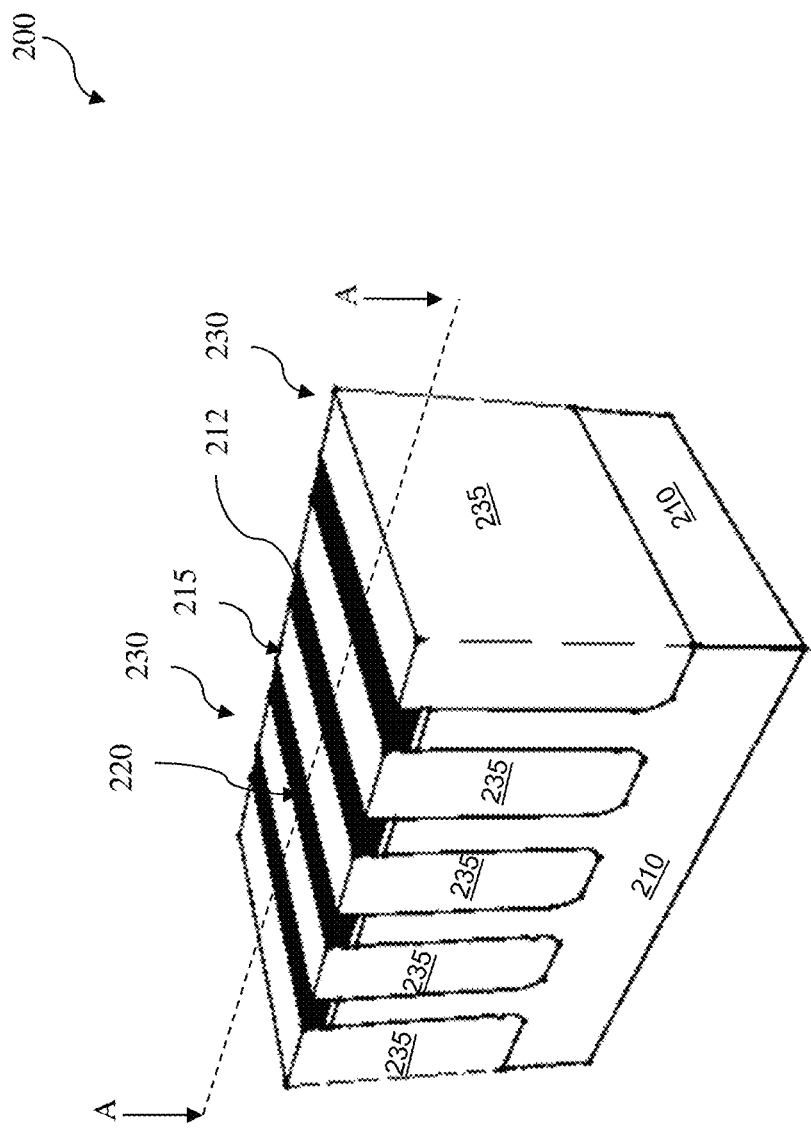
FIG. 3A is a diagrammatic perspective view of a FinFET device undergoing processes according to an embodiment of the present disclosure.
Figure 3B:
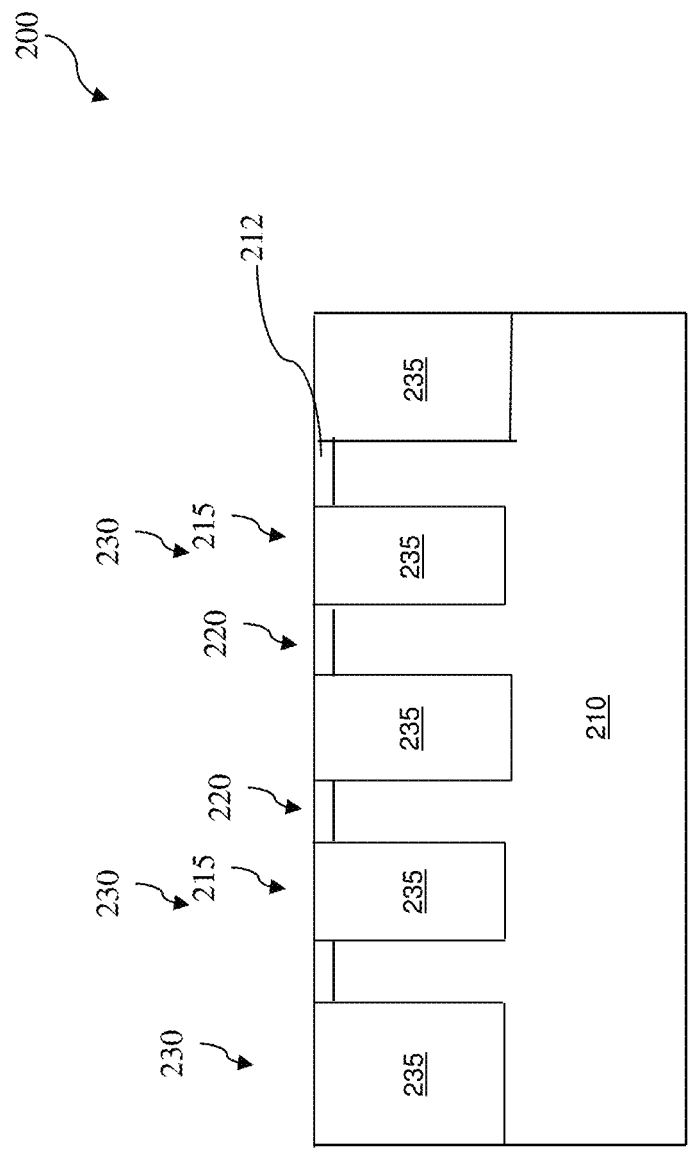
FIG. 3B is a cross-sectional view of an example FinFET device along line A-A in FIG. 3A at fabrication stages constructed according to the method of FIG. 1.

FIG. 3A is a diagrammatic perspective view of another embodiment of a FinFET device 200 undergoing processes according to the method of FIG. 1. FIG. 3B is a cross-sectional view of an example FinFET device 200 along line A-A in FIG. 3A.

Figure 7:
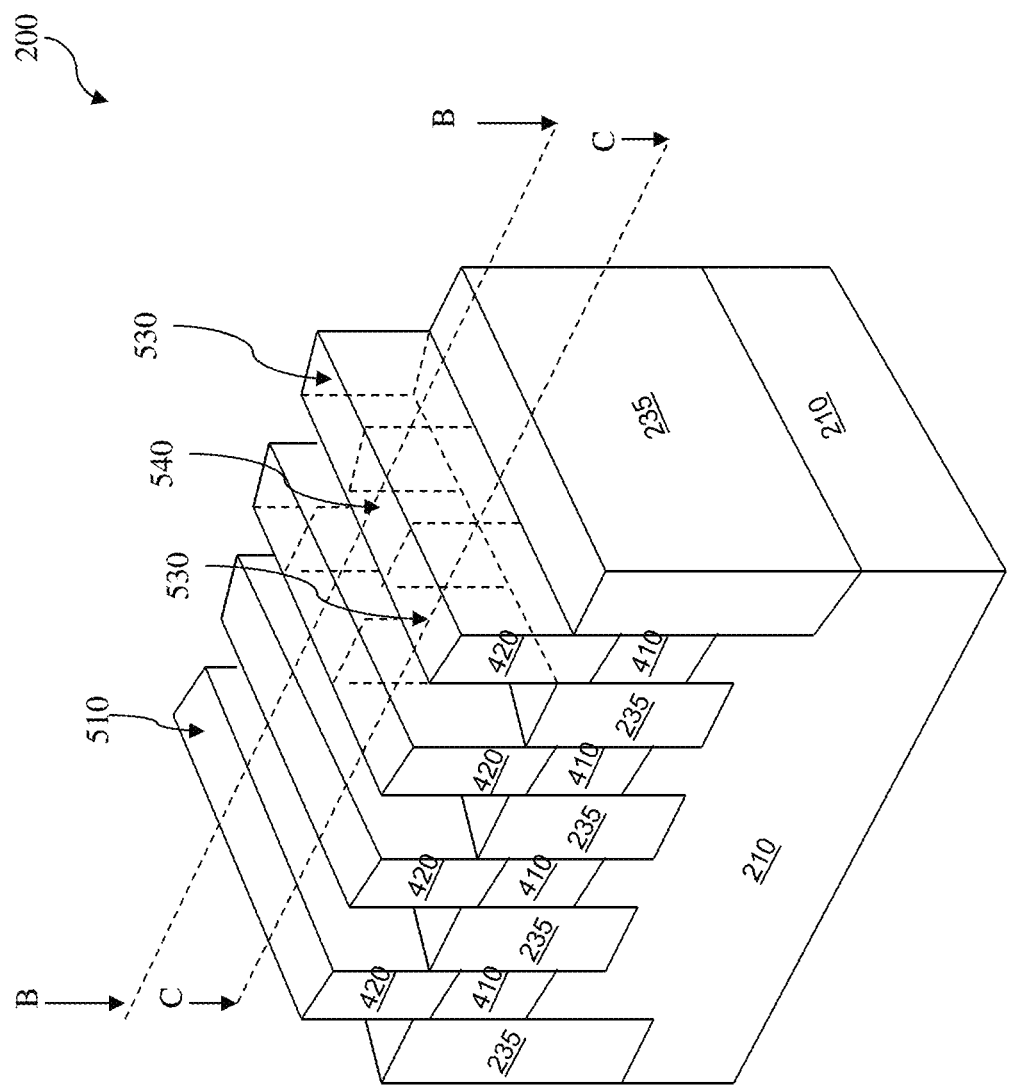
FIG. 7 is a diagrammatic perspective view of a FinFET device undergoing processes according to an embodiment of the present disclosure.

FIG. 7 is a diagrammatic perspective view of another embodiment of a FinFET device 200 undergoing processes according to an embodiment according to the method of FIG. 1. FIGS. 8 and 10-13 are cross-sectional views of the FinFET device 200 of FIG. 7 along line B-B; and FIG. 9 is a cross-sectional view of the FinFET device along line C-C. The line B-B is parallel to the line C-C.

Figure 2B:
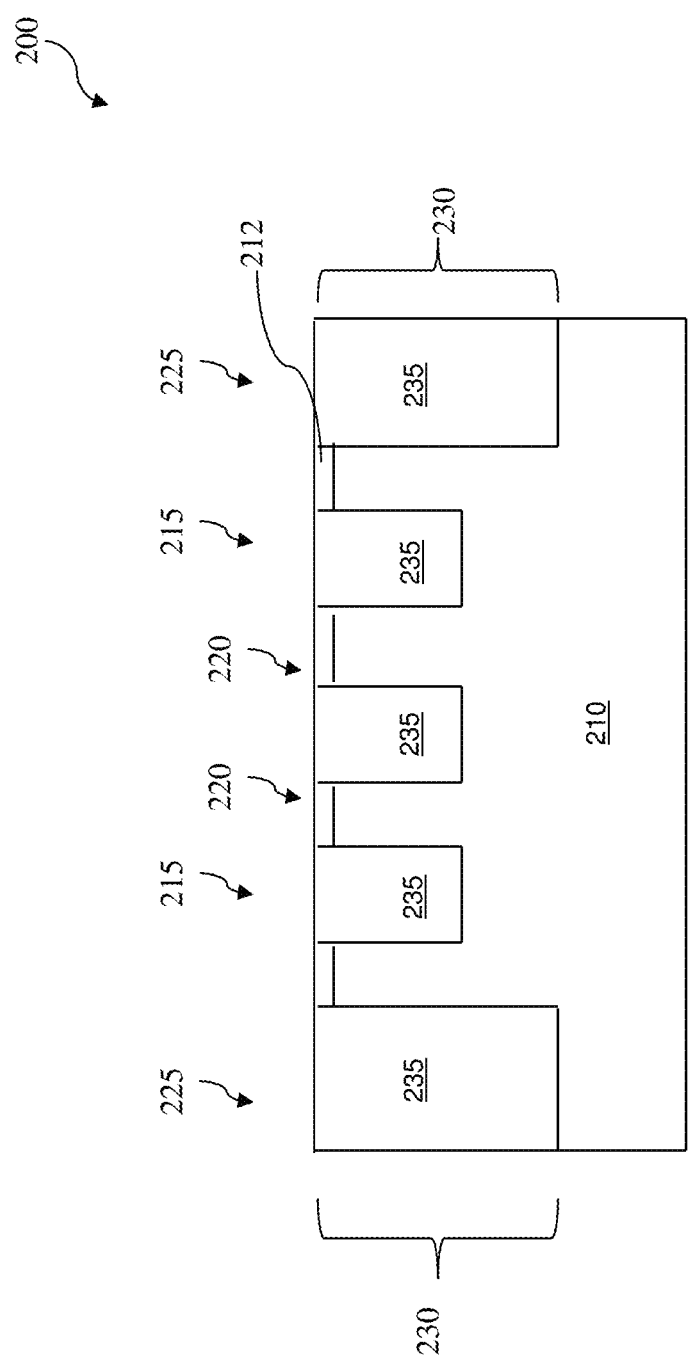
FIG. 2B is a cross-sectional view of an example FinFET device along line A-A in FIG. 2A at fabrication stages constructed according to the method of FIG. 1.

Referring to FIGS. 1 and 2A-2B, the method 100 begins at step 102 by providing a substrate 210. In the present embodiment, the substrate 210 is a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET precursors, the insulator layer is a component (e.g., layer) of a silicon-on-insulator substrate.

The substrate 210 may include various doped regions depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

A first fin 220 is formed over the substrate 210. In some embodiments, the substrate 210 includes more than one first fin 220. The first fin 220 is formed by any suitable process including various deposition, photolithography, and/or etching processes. As an example, the first fin 220 is formed by patterning and etching a portion of the silicon substrate 210, referred to as first trenches 215. In another example, the first fin 220 is formed by patterning and etching a silicon layer deposited overlying an insulator layer (for example, an upper silicon layer of a silicon-insulator-silicon stack of an SOI substrate. Additionally, a first hard mask layer 212 is deposited over the substrate 210 prior to patterning and etching processes. The first hard mask layer 212 includes silicon oxide, silicon nitride, silicon oxynitride, or any other suitable dielectric material. The first hard mask layer 212 may be a single layer or multiple layers. The first hard mask layer 212 can be formed by thermal oxidation, chemical oxidation, atomic layer deposition (ALD), or any other appropriate method. It is understood that multiple parallel first fins 220 may be formed in a similar manner.

Various isolation regions 230 are formed in or on the substrate 210. The isolation regions 230 may be formed using traditional isolation technology, such as shallow trench isolation (STI), to define and electrically isolate the various regions. As one example, the formation of an STI includes a photolithography process, etching a second trench 225 in the substrate 210, filling the second trench 225 (for example, by using a chemical vapor deposition process) with one or more dielectric layers 235. The dielectric material includes silicon oxide, silicon nitride, silicon oxynitride, or other suitable materials, or combinations thereof. In the present embodiment, second trenches 225 are substantially deeper and wider than first trenches 215. Between two second trenches, there is one or more first trenches 215. The first trenches 215 are filled with the dielectric layer 235 as the same time of filling the second trenches 225. In some examples, the filled trenches, 215 and 225, may have a multi-layer structure such as a thermal oxide liner layer filled with silicon nitride or silicon oxide.

Referring to FIGS. 3A and 3B, in another embodiment, the isolation regions 230 are formed by filling in the first trench 215 with the dielectric layer 235.

Additionally, a chemical mechanical polishing (CMP) process is performed to remove excessive dielectric layer 235 and planarize the top surface of the isolation regions 230 with the top surface of the first fin 220. Additionally, the CMP process removes the first hard mask 212 as well.

Figure 4:
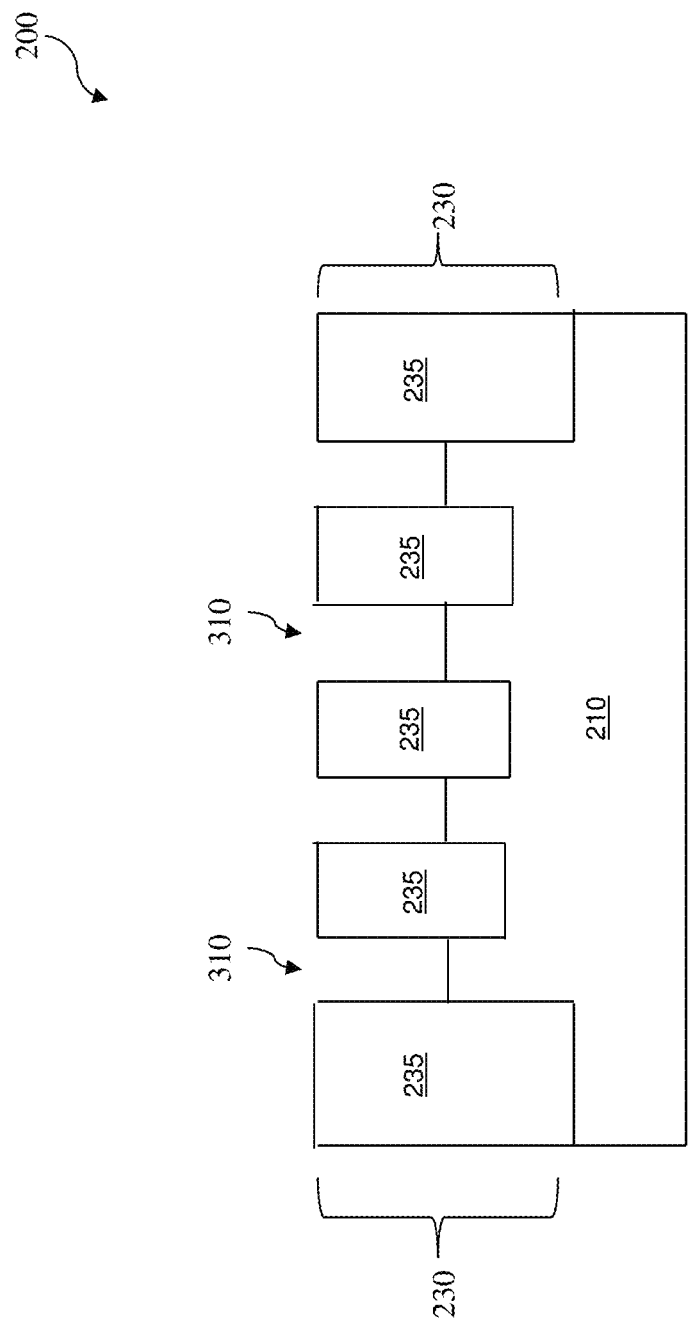
FIGS. 4 to 6 are cross-sectional views of an example FinFET device along line A-A in FIG. 2A at fabrication stages constructed according to the method of FIG. 1

Referring to FIGS. 1 and 4, the method 100 proceeds to step 104 by recessing the first fins 220 to form third trenches 310. The recessing process may include dry etching process, wet etching process, and/or combination thereof. The recessing process may also include a selective wet etch or a selective dry etch. A wet etching solution includes a tetramethylammonium hydroxide (TMAH), a HF/HNO3/CH3COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 5:
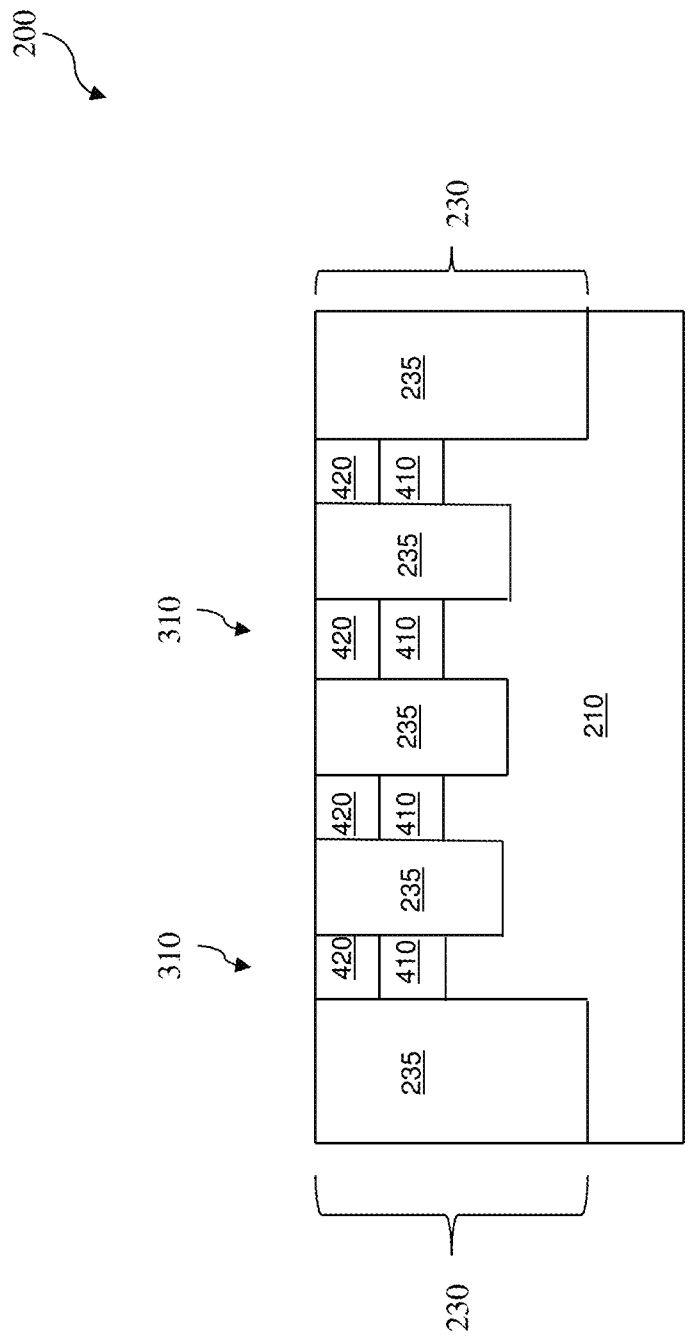

Referring to FIGS. 1 and 5, the method 100 proceeds to step 106 by depositing a first semiconductor material layer 410 to partially fill in the third trenches 310 and a second semiconductor material layer 420 over top of the first semiconductor material 410. The first and second semiconductor material layers, 410 and 420, may be deposited by epitaxial growing processes. The epitaxial processes include chemical vapor deposition (CVD) deposition techniques (e.g., vapor-phase epitaxy (VPE) and/or ultra-high vacuum CVD (UHV-CVD)), molecular beam epitaxy, and/or other suitable processes. The first and second semiconductor material layers, 410 and 420, may include germanium (Ge), silicon (Si), gallium arsenide (GaAs), aluminum gallium arsenide (AlGaAs), silicon germanium (SiGe), gallium arsenide phosphide (GaAsP), or other suitable materials. In one embodiment, the first semiconductor material layer 410 is SiGe and the second semiconductor material layer 420 is Si. Additionally, a CMP process may be performed to remove excessive semiconductor material layers, 410 and 420, and planarize top surfaces of the semiconductor material layer 420 and the isolation region 230.

Figure 6:
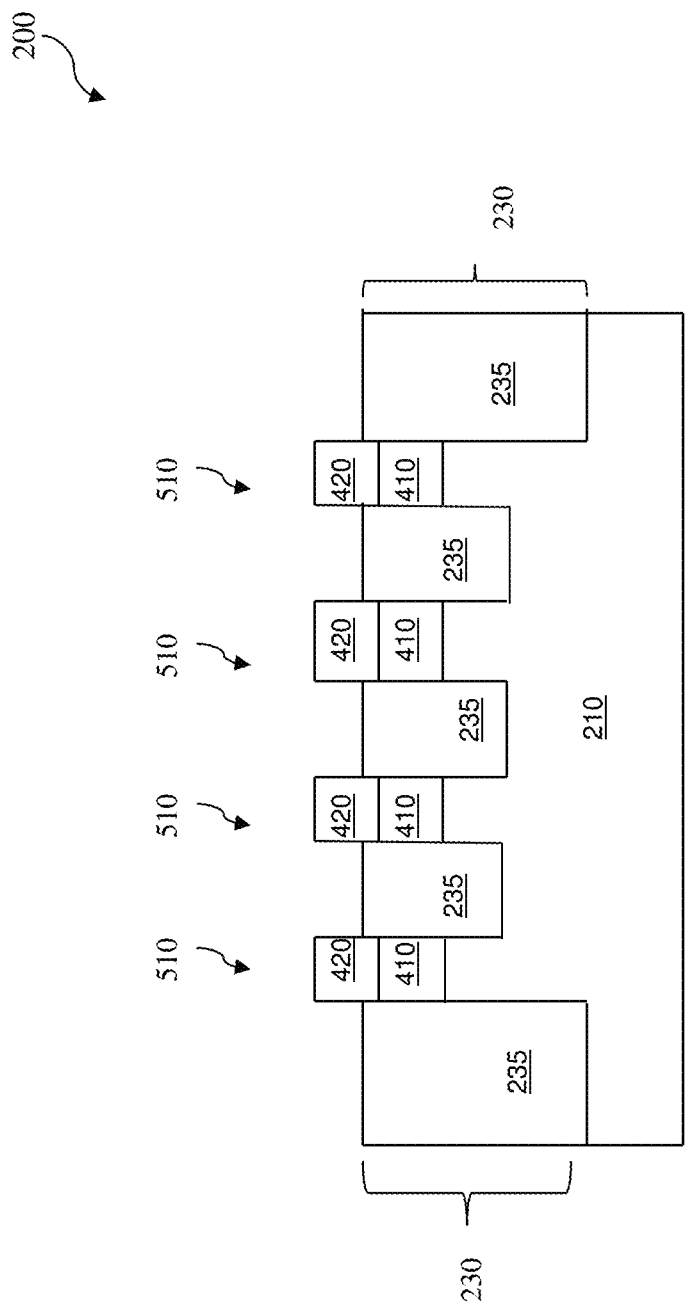

Referring to FIGS. 1 and 6, the method 100 proceeds to step 108 by recessing the dielectric layer 235 around the second and first semiconductor material layers, 420 and 410, to laterally expose the second semiconductor material layer 420 and an upper portion of the first semiconductor material layer 410, thereby form second fins 510. In the present embodiment, the second fin 510 is formed as a stack of layers, 420, 410 and 210 (in an order from top to bottom).

The recessing process may include dry etching process, wet etching process, and/or combination thereof.

Referring to FIG. 7, in present embodiment, a portion of the second fin 510 is defined as source/drain regions 530 while another portion is defined as a gate region 540. The source/drain regions 530 are separated by the gate region 540.

Figure 8:
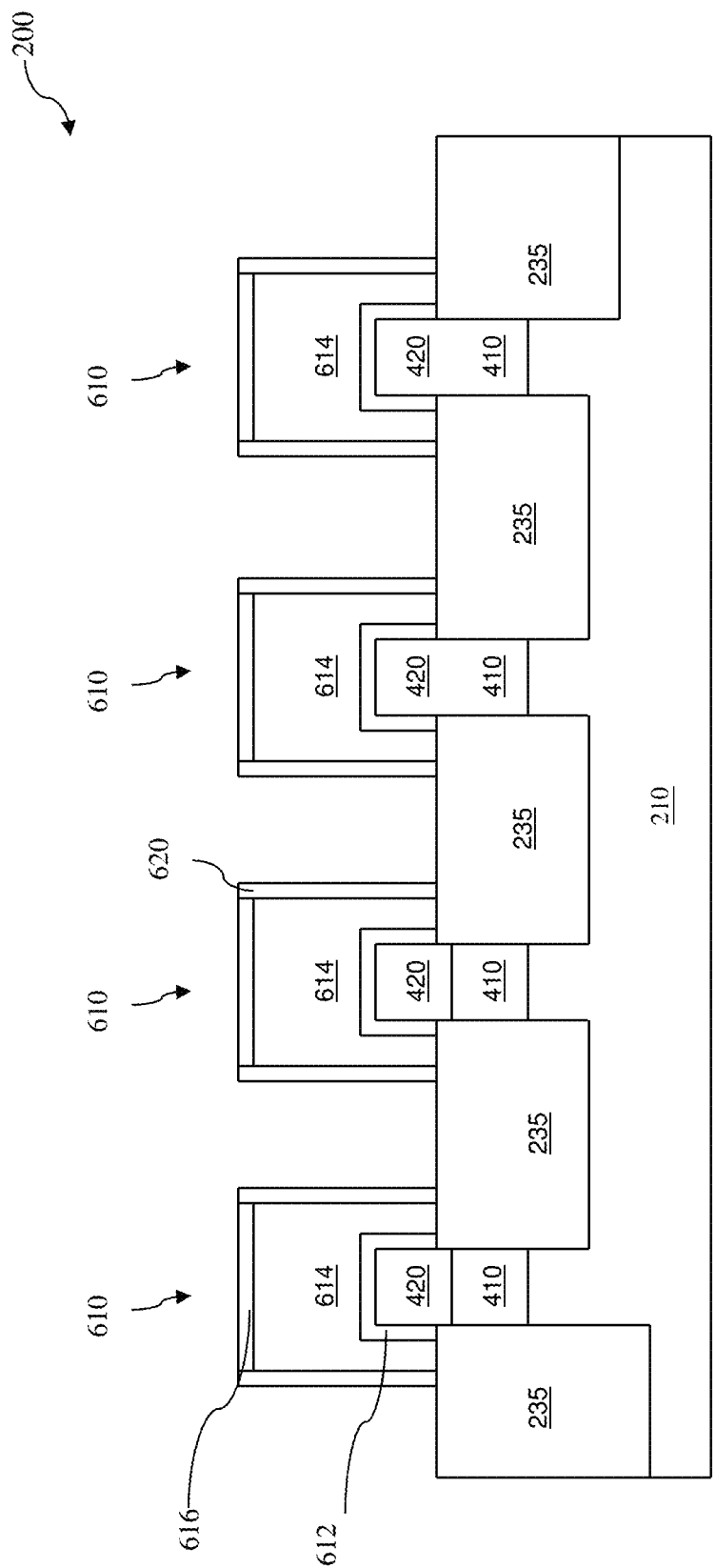
FIGS. 8, 10, 11, 12 and 13 are cross-sectional views of an example FinFET device along line B-B in FIG. 7 at fabrication stages constructed according to the method of FIG. 1.
Figure 9:
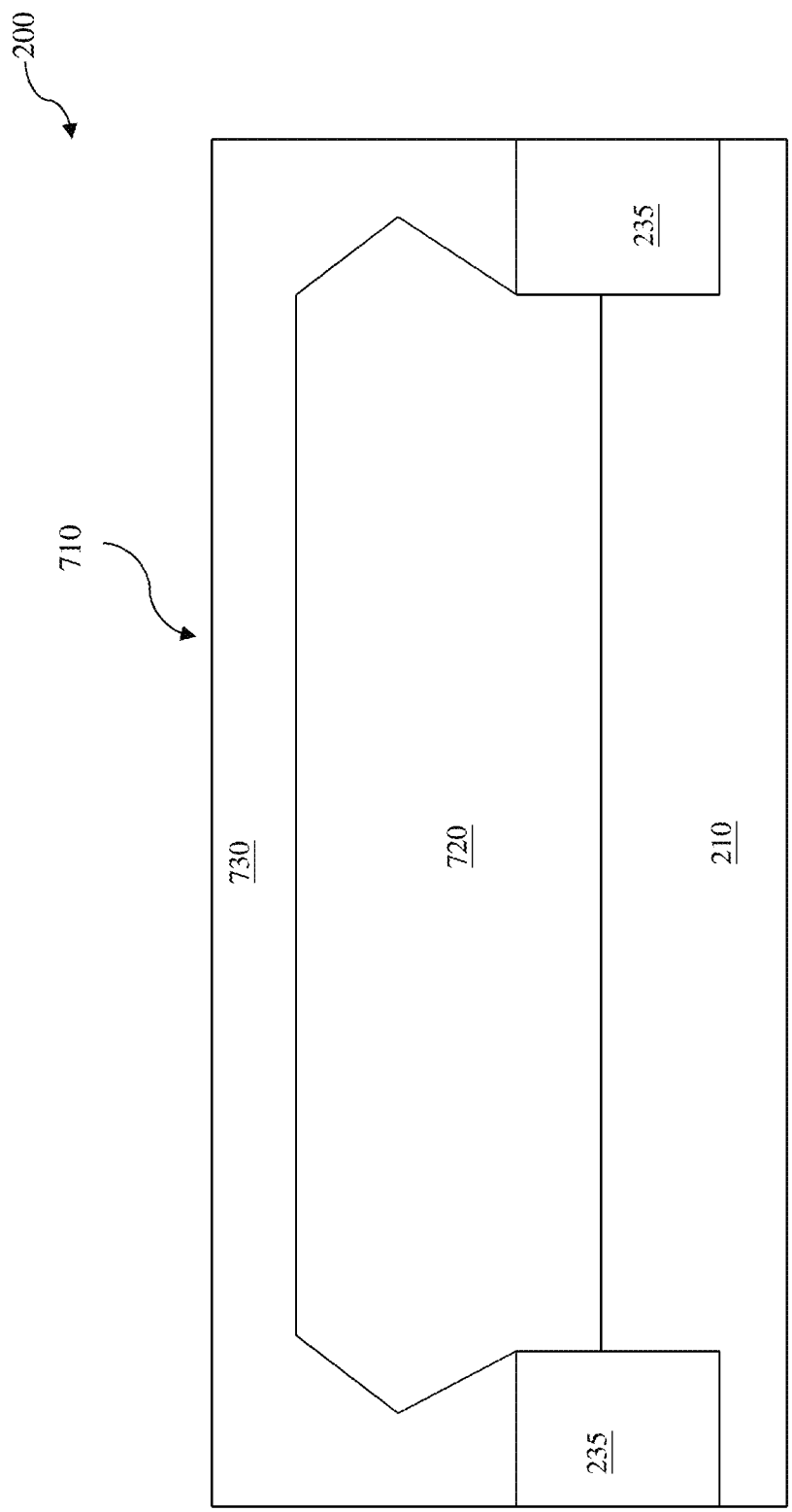
FIG. 9 is a cross-sectional view of an example FinFET device along line C-C in FIG. 7 at fabrication stages constructed according to the method of FIG. 1.

Referring to FIGS. 1 and 8, the method 100 proceeds to step 110 by forming a gate stack 610 and sidewall spacers 620 along the gate stack 610 in the gate region 540, including wrapping over a portion of the second fins 510. In a gate first process, the gate stack 610 may be all or part of a functional gate. Conversely, in a gate last process, the gate stack 610 may be a dummy gate. In the present embodiment, the gate stack 610 is a dummy gate. The dummy gate stacks 610 are to be replaced later by a high-k (HK) and metal gate (MG) after high thermal temperature processes are performed, such as thermal processes during sources/drains formation. The dummy gate stack 610 is formed over the substrate 210 including wrapping over a portion of the second fins 510. The dummy gate stack 610 may include a dielectric layer 612, a polysilicon layer 614 and a second hard mask 616. The dummy gate stack 610 is formed by any suitable process or processes. For example, the gate stack 610 can be formed by a procedure including depositing, photolithography patterning, and etching processes. The deposition processes include CVD, physical vapor deposition (PVD), ALD, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching). The dielectric layer 612 includes silicon oxide, silicon nitride, or any other suitable materials. The second hard mask 616 includes any suitable material, for example, silicon nitride, silicon oxynitride and silicon carbide.

The sidewall spacers 620 may include a dielectric material such as silicon oxide, silicon nitride, silicon carbide, silicon oxynitride, or combinations thereof. The sidewall spacers 620 may include a multiple layers. Typical formation methods for the sidewall spacers 620 include depositing a dielectric material over the gate stack 610 and then anisotropically etching back the dielectric material. The etching back process may include a multiple-step etching to gain etch selectivity, flexibility and desired overetch control.

Referring again to FIGS. 1 and 9, the method 100 proceeds to step 112 by forming a source/drain feature 720 in the source/drain regions 530. In one embodiment, individual second fins 510 between two isolation regions 230 are removed, as well as the dielectric layer 235 between each second fins 510, to form a common source/drain trench 710 over the substrate 210. The recessing process may include dry etching process, wet etching process, and/or combination thereof. The recessing process may also include a selective wet etch or a selective dry etch. The recessing process may include multiple etching processes. In another embodiment, instead of forming a common source/drain trench 710, the source/drain trench 710 is formed in an individual type between two isolation regions 230, referred to as an individual source/drain trench 710. The individual source/drain trench 710 is formed by recessing a portion of second fins 510 between two isolation regions 230.

A third semiconductor material epitaxially grows in the source/drain trench 710 to form the source/drain feature 720. The third semiconductor material includes Ge, Si, GaAs, AlGaAs, SiGe, GaAsP, or other suitable material. The common source/drain feature 720 may be formed by one or more epitaxy or epitaxial (epi) processes. The source/drain features 720 may be in-situ doped during the epi process. For example, the epitaxially grown SiGe source/drain features 720 may be doped with boron; and the epitaxially grown Si epi source/drain features 720 may be doped with carbon to form Si:C source/drain features, phosphorous to form Si:P source/drain features, or both carbon and phosphorous to form SiCP source/drain features. In one embodiment, the source/drain features 720 are not in-situ doped, an implantation process (i.e., a junction implant process) is performed to dope the source/drain features 720.

In one embodiment, a single source/drain feature 720 is formed between two isolation regions 230 by epitaxially growing the third semiconductor material in the common source/drain trench 710. In another embodiment, a multiple source/drain features 720 are formed between two isolation regions 230 by epitaxially growing the third semiconductor material in the individual source/drain trench 710.

Additionally, an interlayer dielectric (ILD) layer 730 is formed between the dummy gate stacks 610 over the substrate 210. The ILD layer 730 includes silicon oxide, oxynitride or other suitable materials. The ILD layer 730 includes a single layer or multiple layers. The ILD layer 730 is formed by a suitable technique, such as CVD, ALD and spin-on (SOG). A chemical mechanical polishing (CMP) process may be performed to remove excessive ILD layer 730 and planarize the top surface of the ILD layer 730 with the top surface of the dummy gate stacks 610.

Figure 10:
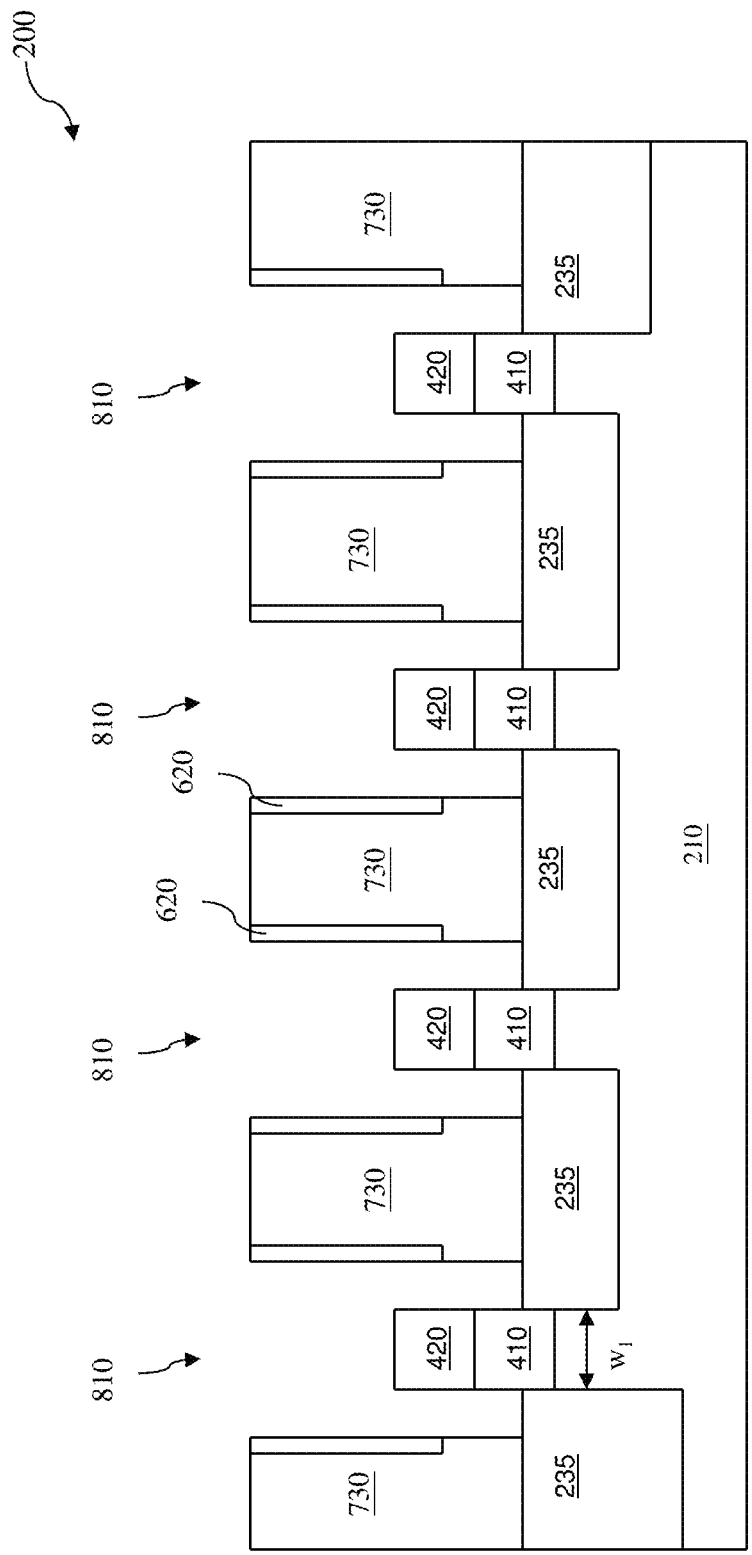

Referring to FIGS. 1 and 10, the method 100 proceeds to step 114 by removing the dummy gate stacks 610 to form a gate trench 810 and recessing the dielectric layer 235 in the gate trench 810 to laterally expose at least a portion of the first semiconductor material layer 410 of the second fin 510. The etching processes may include selective wet etch or selective dry etch, such that having an adequate etch selectivity with respect to the first and second semiconductor material layers, 410 and 420, and the sidewall spacer 620. Alternatively, the dummy gate stack 610 and the dielectric layer 235 may be recessed by a series of processes including photolithography patterning and etching back. After the recess, the first semiconductor material layer 410 has a first width $w_1$.

Figure 11:
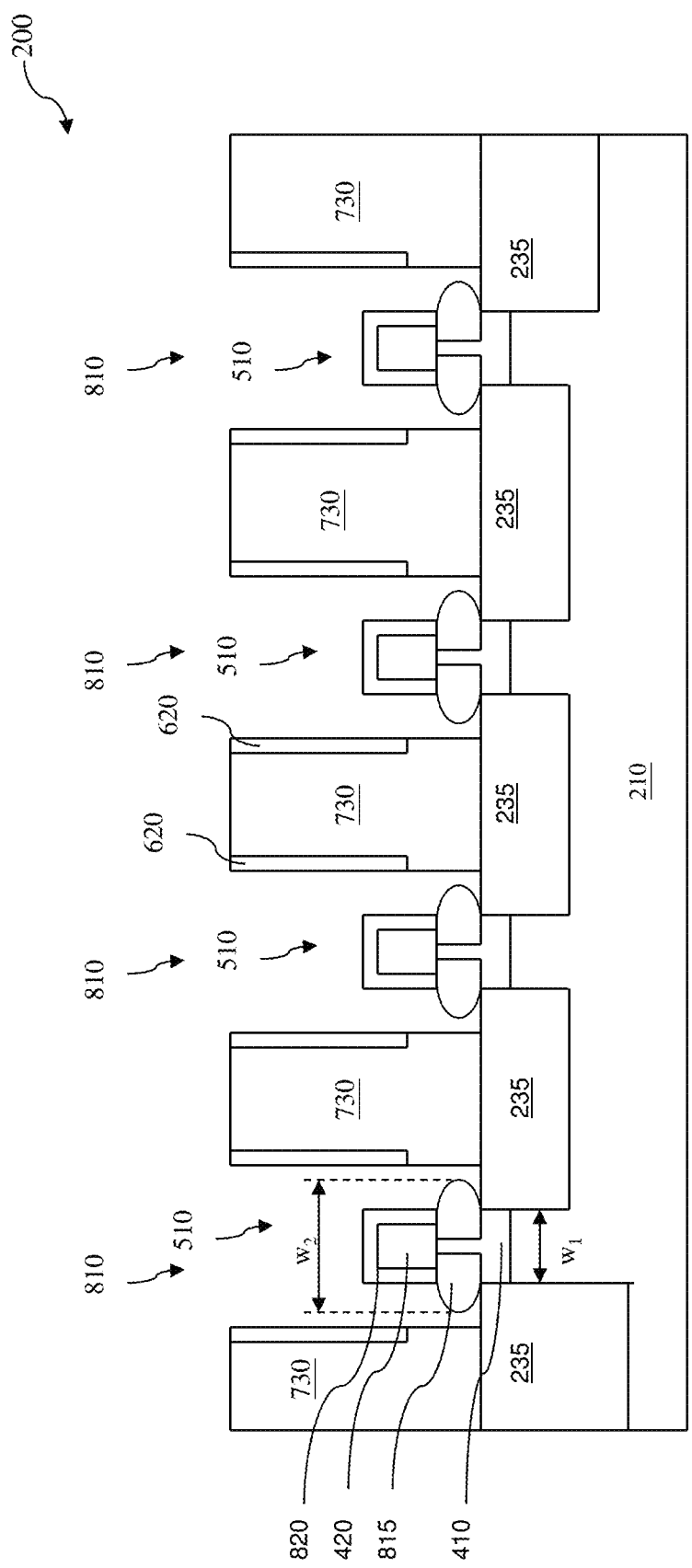

Referring to FIGS. 1 and 11, the method 100 proceeds to step 116 by performing a thermal oxidation process to the exposed first and second semiconductor material layers, 410 and 420 in the second fin 510 in the gate trench 810. In the one embodiment, the thermal oxidation process is conducted in oxygen ambient. In another embodiment, the thermal oxidation process is conducted in a combination of steam ambient and oxygen ambient. During the thermal oxidation process, a portion of the exposed first semiconductor material layer 410 in the second fin 510 converts to a first semiconductor oxide layer 815 with a second width $w_2$ and simultaneously at least an outer layer of the exposed second semiconductor material layer 420 converts to a second semiconductor oxide 820.

During the thermal oxidation process, the first semiconductor material layer 410 obtains a volume expansion. In the present embodiment, the first and second semiconductor material layers, 410 and 420, and the thermal oxidation process are configured that the first semiconductor material layer 410 obtains a volume expansion with a ratio of $w_2$ to $w_1$ being larger than 1.6 to achieve a desired degree of channel strain, such as 1 Gpa of tensile strain. As an example, the first semiconductor material layer 410 is $SiGe_{x_1}$ having a thickness in a range of 5 nm to 20 nm, where $x_1$ is a first Ge composition in atomic percent of a range from 0.2 to 0.5. While the second semiconductor material layer 420 is Si having a thickness in a range of 20 nm to 40 nm. The thermal oxidation process is conducted in a combination of steam ambient and oxygen ambient with one atmospheric pressure and a temperature in a range from 400° C. to 600° C. During the thermal oxidation process, an outer portion of the $SiGe_{x_1}$ layer 410 converts to a silicon germanium oxide ($SiGeO_y$) layer 815, where y is oxygen composition in atomic percent, and obtains a volume expansion with a ratio of 1.8 of $w_2$ to $w_1$. A center portion of $SiGe_{x_1}$ layer 410 changes to a second Ge composition $x_2$, which is much higher than $x_1$. A size and shape of the center portion of $SiGe_{x_2}$ vary with process conditions, such as thermal oxidation temperature and time. Simultaneously the outer layer of the Si layer 420 converts to silicon oxide ($SiO_z$) 820, where z is oxygen composition in atomic percent. By volume expansion of the $SiGeO_y$ layer 815, a tensile strain may be induced to the second fin 510 in the gate region 540, where a gate channel is to be formed.

Figure 12:
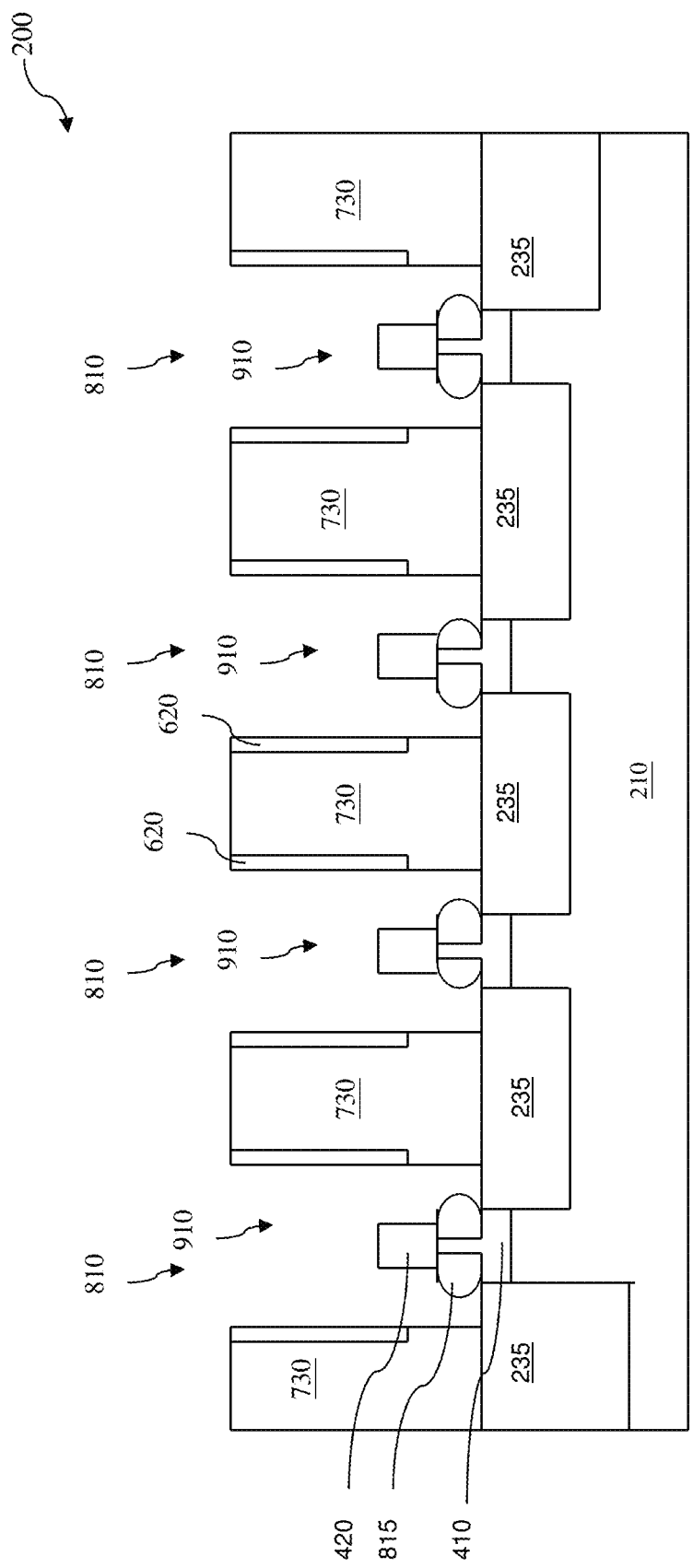

Referring to FIGS. 1 and 12, the method 100 proceeds to step 118 by removing the second semiconductor oxide layer 820 and a portion of an outer layer of the first semiconductor oxide layer 815 to reveal a third fin 910 in the gate region 540. The removing process includes a dry etch, a wet etch, or a combination of. For example, a selective wet etch or a selective dry etch is performed with adequate etch selectivity with respect to the first and second semiconductor material layers, 410 and 420. The third fin 910 is configured such that it has the second semiconductor material layer 420 as an upper portion, the first semiconductor oxide layer 815 as a middle portion and the first semiconductor material layer 410 as a lower portion.

Figure 13:
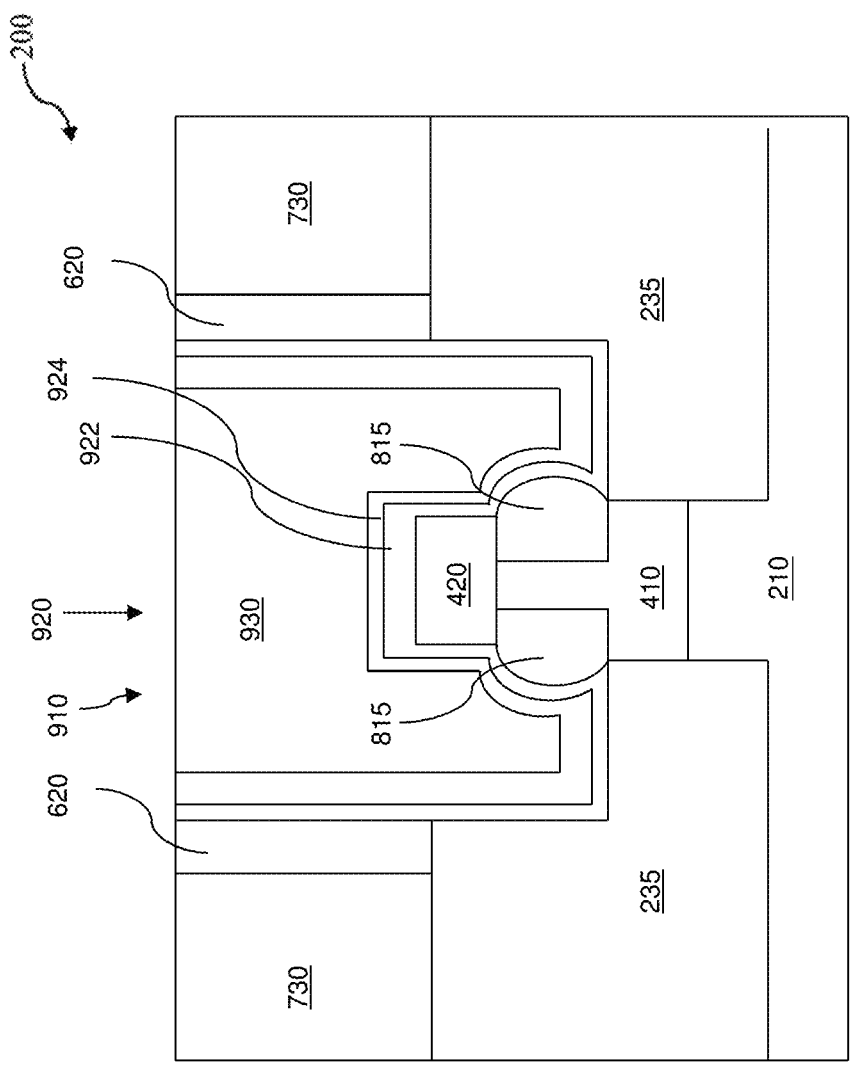

Referring to FIGS. 1 and 13, the method 100 proceeds to step 120 by forming a high-k (HK)/metal gate (MG) 920 over the substrate 210, including wrapping over a portion of the third fin 910 in the gate region 540, where the third fin 910 serve as gate channel regions. An interfacial layer (IL) 922 is deposited by any appropriate method, such as ALD, CVD and ozone oxidation. The IL 922 includes oxide, HfSiO and oxynitride. A HK dielectric layer 924 is deposited over the IL 922 by suitable techniques, such as ALD, CVD, metal-organic CVD (MOCVD), PVD, thermal oxidation, combinations thereof, or other suitable techniques. The HK dielectric layer 924 may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials.

A metal gate (MG) layer 930 may include a single layer or multi layers, such as metal layer, liner layer, wetting layer, and adhesion layer. The MG layer 930 may include Ti, Ag, Al, TiAlN, TaC, TaCN, TaSiN, Mn, Zr, TiN, TaN, Ru, Mo, Al, WN, Cu, W, or any suitable materials. The MG layer 930 may be formed by ALD, PVD, CVD, or other suitable process. The MG layer 930 may be formed separately for the N-FET and P-FFET with different metal layers. A CMP may be performed to remove excessive MG layer 930. The CMP provides a substantially planar top surface for the metal gate layer 930 and the ILD layer 730.

The FinFET device 200 may undergo further CMOS or MOS technology processing to form various features and regions known in the art. For example, subsequent processing may form various contacts/vias/lines and multilayers interconnect features (e.g., metal layers and interlayer dielectrics) over the substrate 210, configured to connect the various features or structures of the FinFET device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional steps can be provided before, during, and after the method 100, and some of the steps described can be replaced or eliminated for other embodiments of the method.

Based on the above, the present disclosure offers a semiconductor device with a strain gate by using volume expansion technique and a single source/drain feature to server multiple gates. The volume expansion technique induces sufficient strain to the gate channel to improve device performance and the single source/drain feature benefits source/drain resistance reduction.

The present disclosure provides many different embodiments of a semiconductor device. The semiconductor device includes a substrate having isolation regions, a gate region, source and drain (S/D) regions separated by the gate region, a first fin structure in a gate region. The first fin structure includes a first semiconductor material layer as a lower portion of the first fin structure, a semiconductor oxide layer as an outer portion of a middle portion of the first fin structure, the first semiconductor material layer as a center portion of the middle portion of the first fin structure and a second semiconductor material layer as an upper portion of the first fin structure. The semiconductor device also includes a source/drain feature over the substrate in the source/drain region between adjacent isolation regions and a high-k (HK)/metal gate (MG) stack over the substrate including wrapping over a portion of the first fin structure in the gate region.

In another embodiment, a FinFET device includes a substrate having isolation regions, a gate region, source and drain regions separated by the gate region, a first fin structure in a gate region. The first fin structure includes a silicon germanium ($SiGe_x$) layer as a lower portion, where x is Ge composition in atomic percent, a silicon germanium oxide ($SiGeO_y$) layer as an outer portion of a middle portion, where y is oxygen composition in atomic percent, a $SiGe_z$ layer as a center portion of the middle portion, where z is Ge composition in atomic percent and a Si layer as an upper portion. The FinFET device also includes a source/drain feature in the source and drain regions and a high-k/metal gate (HK/MG) over the substrate including wrapping over a portion of the first fin structure in the gate region.

In yet another embodiment, a method for fabricating a FinFET device includes providing a substrate. The substrate includes first fins having a gate region, source and drain regions separated by the gate region, intra isolation regions between first fins and isolation regions containing multiple intra isolation regions. The method also includes recessing the first fins, epitaxially growing a first semiconductor material layer over the recessed first fins, epitaxially growing a second semiconductor material over top of the first semiconductor material layer, recessing the intra isolation region to laterally expose an upper portion of the second semiconductor material to form second fins, forming a dummy gate stack over the substrate including wrapping over a portion of the second fins in the gate region, removing another portion of the second fins beside of the dummy gate stack in source and drain region. epitaxially growing a third semiconductor material over recessed second fins to form a single source/drain feature between two adjacent isolation regions, removing the dummy gate stack to form a gate trench, recessing the intra isolation regions in the gate trench to laterally exposed a portion of the first semiconductor material in the second fins, applying a thermal oxidation process to the first and second semiconductor material layers of the second fin in the gate trench to convert an outer portion of the exposed first semiconductor material to a first semiconductor oxide and outer layer of the second semiconductor to a second semiconductor oxide, removing the second semiconductor oxide to reveal the second semiconductor material as the upper portion of the second fin in the gate trench and forming a high-k/metal gate (HK/MG) stack wrapping over a portion of the second fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a substrate having a fin extending between a plurality of isolation regions, wherein the fin includes a first fin portion, a second fin portion on the first fin portion, and a third fin portion on the second fin portion, wherein the second fin portion has a different semiconductor composition from the third fin portion;
oxidizing the second fin portion having the different semiconductor composition to form an oxide layer, wherein the oxidizing the second fin modifies the third fin portion; and
forming a gate stack on the oxide layer and the modified third fin portion such that a dielectric layer of the gate stack is disposed on the oxide layer and the modified third fin portion, and wherein a gate metal layer of the gate stack is disposed on two opposing side surfaces of the dielectric layer and a top surface of the dielectric layer.

2. The method of claim 1, wherein the oxidizing is performed in a combination of an oxygen ambient and a steam ambient.

3. The method of claim 1, further comprising: forming the second fin portion by performing a first epitaxial process to form the second fin portion of a first material; and
forming the third fin portion by performing a second epitaxial process to form the third fin portion of a second material grown on the first material.

4. The method of claim 1, wherein the first fin portion and the second fin portion are different materials.

5. The method of claim 1, wherein providing the substrate includes forming the second fin portion epitaxially on the first fin portion.

6. The method of claim 1, wherein the dielectric layer is an interfacial layer of the gate stack.

7. The method of claim 1, wherein the dielectric layer includes a gate dielectric layer.

8. A method comprising:
providing a fin having a first portion, a second portion over the first portion, and a third portion over the second portion, wherein the third portion defines a top surface of the fin;
oxidizing the second portion to form an oxidized second region;
oxidizing at least one sidewall of the third portion to form an oxidized third region on a center region of the third portion, wherein the center region is a semiconductor material;
removing the oxidized third region to expose a top surface and two lateral sidewalls of the center region of the third portion; and
forming a gate structure over the top surface and the two lateral sidewalls of the center region of the third portion.

9. The method of claim 8, wherein the oxidizing the second portion and the oxidizing the at least one sidewall of the third portion is performed by a single thermal oxidation process.

10. The method of claim 8, where the forming the gate structure includes forming a layer of the gate structure directly on the sidewalls and the top surface of the semiconductor material.

11. The method of claim 10, wherein the forming the layer of the gate structure includes forming an interfacial layer of the gate structure.

12. The method of claim 8, wherein the forming the gate structure includes forming a layer of the gate structure directly on the oxidized second region.

13. The method of claim 8, wherein the oxidizing the second portion to form the oxidized second region includes oxidizing an outer region of the second portion adjacent a sidewall of the second portion while not oxidizing a center region of the second portion.

14. The method of claim 8, wherein prior to the oxidizing the second portion, the second portion includes a first Ge composition, and wherein after the oxidizing a center region of the second portion adjacent the oxidized second region includes a second Ge composition, the second Ge composition greater than the first Ge composition.

15. The method of claim 8, wherein removing the oxidized third region to expose the semiconductor composition of the third portion includes performing an etch selective to an oxide of the semiconductor material.

16. The method of claim 8, wherein the oxidizing the second portion forms the oxidized second region at the sidewalls of the second portion.

17. A method comprising:
providing a substrate having a fin extending between a plurality of isolation regions;
oxidizing a middle region of the fin wherein at least a portion of the middle region lies above the isolation region, wherein the oxidizing forms an oxide layer and an upper fin portion above the oxide layer and a lower fin portion below the oxide layer and forms a second oxide layer on sidewalls of the upper fin portion;
wherein the middle region of the fin has a different composition than the upper fin, prior to the oxidizing;
removing the second oxide layer to expose the sidewalls of the upper fin portion, wherein after the removing the second oxide layer, the oxide layer has uppermost surface interfacing a bottom surface of the upper fin portion; and
forming a gate stack over the upper fin portion such that an interfacial layer of the gate stack is disposed on the oxide layer and the upper fin portion and a gate dielectric layer is disposed on two opposing side surfaces of the interfacial layer and a top surface of the interfacial layer therebetween.

18. The method of claim 17, further comprising: wherein the forming the gate stack includes forming a metal gate layer over the gate dielectric layer.

19. The method of claim 17, wherein the oxidizing is conducted in a combination of a steam ambient and an oxygen ambient.

* * * * *